United States Patent
Katagiri et al.

(10) Patent No.: US 7,823,096 B2
(45) Date of Patent: Oct. 26, 2010

(54) INDUCTANCE ANALYSIS SYSTEM AND METHOD AND PROGRAM THEREFOR

(75) Inventors: Mitsuaki Katagiri, Tokyo (JP); Takashi Iida, Yokohama (JP); Hiroya Shimizu, Ryugasaki (JP); Satoshi Isa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 914 days.

(21) Appl. No.: 11/495,711

(22) Filed: Jul. 31, 2006

(65) Prior Publication Data

US 2007/0033553 A1 Feb. 8, 2007

(30) Foreign Application Priority Data

Aug. 3, 2005 (JP) ............................. 2005-225573

(51) Int. Cl.
G06F 17/50 (2006.01)
H01L 23/52 (2006.01)
(52) U.S. Cl. ................................. 716/4; 716/1; 257/738
(58) Field of Classification Search ........................ 716/4
See application file for complete search history.

(56) References Cited

U.S. PATENT DOCUMENTS 5,404,310 A * 4/1995 Mitsuhashi ................... 716/13
6,557,154 B1 4/2003 Harada et al.
6,847,907 B1 * 1/2005 Novotny ....................... 702/84

(Continued)

FOREIGN PATENT DOCUMENTS

JP 2001-147952 A 5/2001

(Continued)

OTHER PUBLICATIONS

Takashi Iida et al., "Power/ground plane characteristics govered by uncoupled inductance" Denshi Joho Tsushin Gakkai Gijutsu Kenkyu Hokoku, Institute of Electronics, Information and Communication Engineers, Jan. 30, 2004, vol. 103, No. 648, pp. 69-72 (ICD2003-227), Abstract.

Primary Examiner—Vuthe Siek
Assistant Examiner—Patrick Sandoval
(74) Attorney, Agent, or Firm—Sughrue Mion, PLLC

(57) ABSTRACT

System, method and program for inductance analysis for reducing time for analysis, to cope with increase in the system size, to achieve high accuracy in the analysis. Information on a power supply plane, in a state in which a beginning point of non-coupled current of return current accompanying a signal current is placed in the vicinity of a signal through-hole on the power supply plane, based on position information of said signal through-hole, is received. Potential distribution in the power supply plane is determined and output. The non-coupled inductance from the signal through-hole to the power supply through-hole in the power supply plane is evaluated. In the potential analysis, non-coupled inductance L from the signal through-hole to the power supply through-hole is represented by resistance R. The relationship that a voltage increment $\Delta V$ is represented by the product of the non-coupled inductance L and the rate of time change of the current, $\Delta V = L\Delta I/\Delta t$, is replaced by the relationship that the voltage V is represented by the product of resistance R and non-coupled current I, $V = R \times I$. Potential analysis is performed by analyzing two-dimensional heat diffusion in the power supply plane assuming that a heat source is placed at a beginning point of the non-coupled current.

9 Claims, 7 Drawing Sheets

U.S. PATENT DOCUMENTS

| | | |
|---|---|---|
| 2004/0225487 A1 | 11/2004 | Iwakura et al. |
| 2005/0017357 A1* | 1/2005 | Iida et al. .................... 257/738 |
| 2006/0095876 A1* | 5/2006 | Chandra ........................ 716/4 |
| 2007/0033553 A1* | 2/2007 | Katagiri et al. ................ 716/4 |

FOREIGN PATENT DOCUMENTS

| | | |
|---|---|---|
| JP | 2004-334654 A | 11/2004 |
| JP | 2005-19765 A | 1/2005 |

* cited by examiner

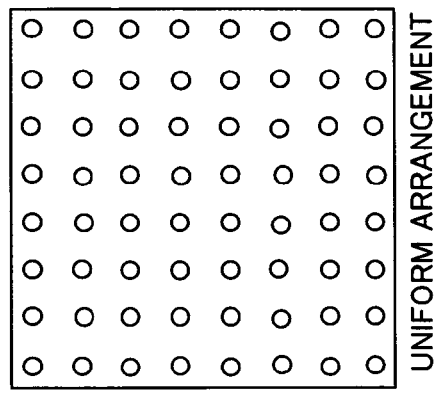

FIG.4A

CONCENTRATED ARRANGEMENT

SIGNAL THROUGH-HOLE (NON-COUPLED CURRENT SPRINGS OUT HERE)

GROUND THROUGH-HOLE (NON-COUPLED CURRENT FLOWS HERE INTO THIS THROUGH-HOLE)

NUMBER OF SIGNALS: 48
NUMBER OF GROUNDS: 16

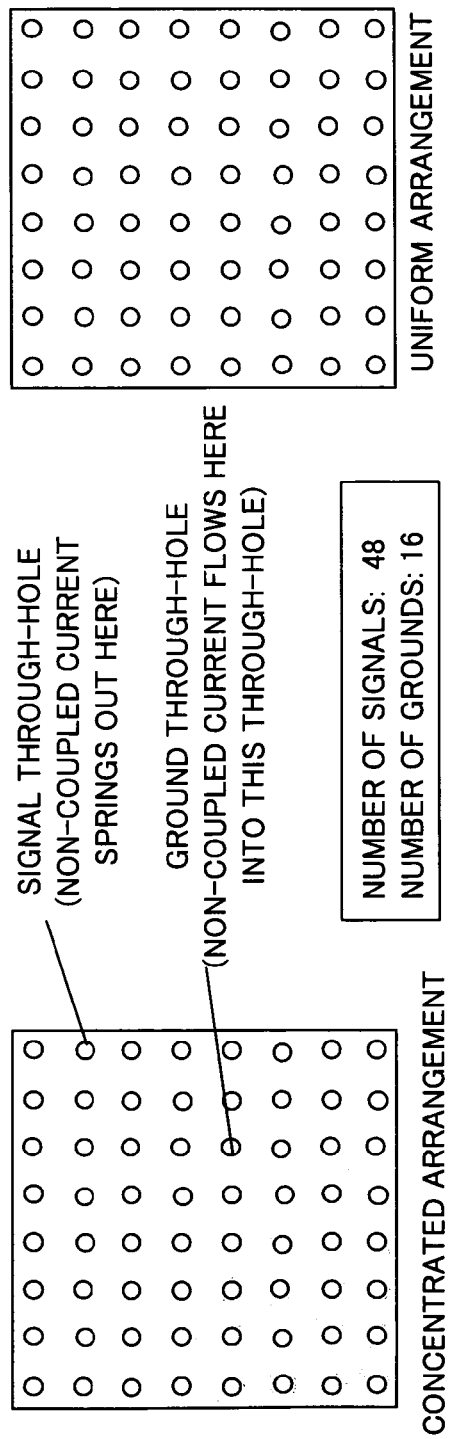

FIG.4B

UNIFORM ARRANGEMENT

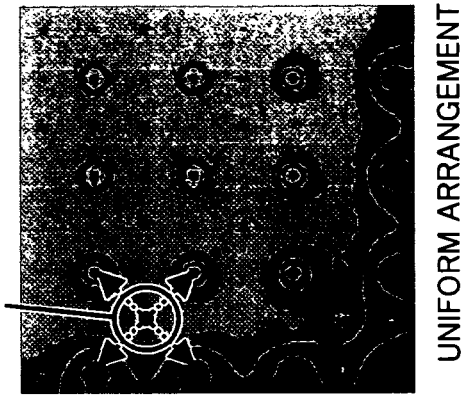

FIG.4D

CURRENT PATHS ARE DISTRIBUTED

UNIFORM ARRANGEMENT

POTENTIAL DISTRIBUTION

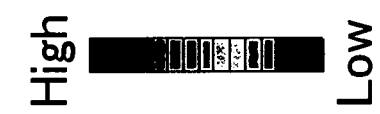

High — Low

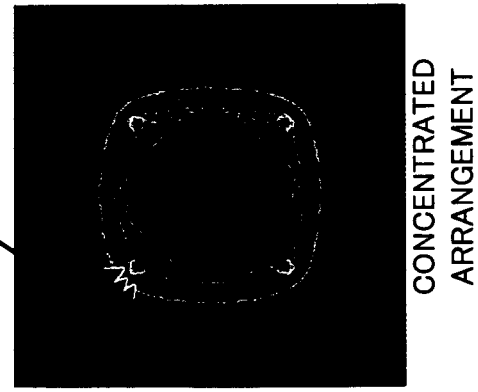

FIG.4C

CURRENT PATHS ARE OVERLAPPED

CONCENTRATED ARRANGEMENT

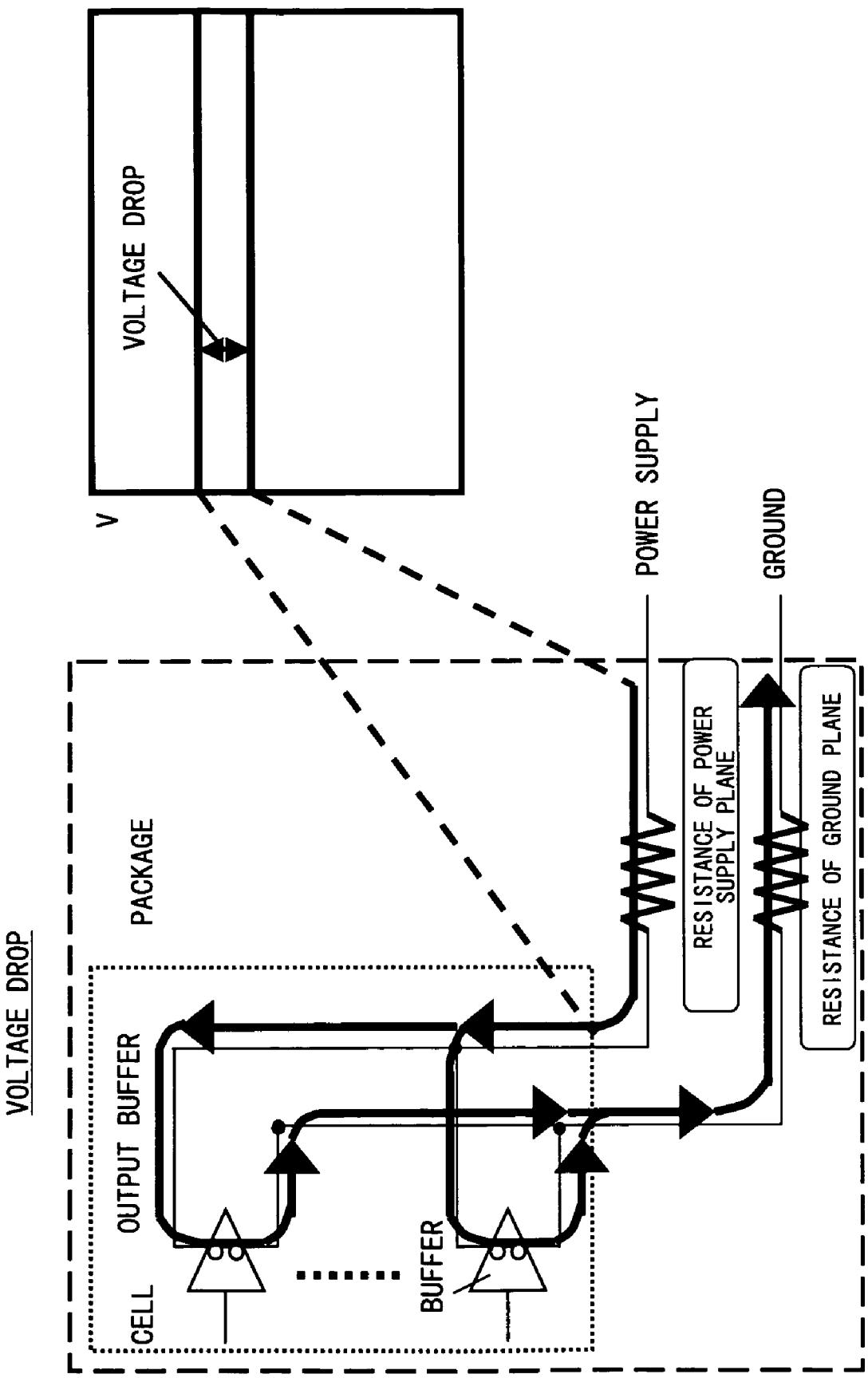

INDUCTANCE ANALYSIS SYSTEM AND METHOD AND PROGRAM THEREFOR

FIELD OF THE INVENTION

This invention relates to a technology for designing and manufacture of semiconductor devices. More particularly, this invention relates to a system, a method and a program for analysis convenient for e.g. a semiconductor package board.

BACKGROUND OF THE INVENTION

A package board, including a core layer and built-up layers and carrying a semiconductor chip and a BGA (ball grid array) terminal on its one major surface and on its opposite major surface, respectively, with an electrode of the semiconductor chip being extended to the BGA surface, has been in extensive use, because the power supply and the ground are provided as planes or layers, with the inductance and the noise being small. However, with increase in the operating frequency of the LSIs in these days, the power supply noise and the ground noise have increased. In particular, the simultaneous switching noise has become of a serious problem.

Reference will now be made to FIG. 6. When a plural number of output buffers become HIGH simultaneously, with the driving waveforms of the output buffers then simultaneously becoming HIGH from LOW, plural signal currents are changed simultaneously. At such time, as the driving currents are changed, the simultaneous switching noise $\Delta V = n \times L \times di/dt$, where n denotes the number of lines of signals switched simultaneously (the number of signals switched) and L denotes the power supply inductance, is generated due to power supply impedance (inductance component L). In case a semiconductor chip has larger numbers of pins and is run at an extremely high speed, as when the chip has tens of IO ports and is run at an operating frequency (transfer speed) as high as several GHz, it becomes highly desirable to decrease the simultaneous switching noise.

Meanwhile, as stated in detail in Patent Document 1, if there is a signal line on a ground plane or layer and signal current flows on such signal line, the return current flows in a direction opposite to the signal current flow direction. The signal current generates an electromagnetic field in a direction perpendicular to its proceeding direction. This electromagnetic field is coupled to an electromagnetic field generated by the return current at a location directly below the signal line, with the inductance at a location directly below the signal line being low. Since the inductance of the ground plane directly below the signal line is low, the return current flows through a region directly below the signal line in a concentrated fashion. The relationship between the return current and non-coupled current will now be explained. The non-coupled current means the current which is not electromagnetically coupled to the signal current. On the other hand, non-coupled inductance means inductance proper to the non-coupled current. The ground planes, facing each other, are interconnected by ground through-holes, while the signal lines are interconnected by signal through-holes and passed through the ground plane. When the current flows through the signal lines, the return current flows on the ground plane in a reverse direction to the signal current flow direction. This return current, flowing in an area directly below the signal line, by the coupled electromagnetic field, is not coupled with the electromagnetic field of the non-coupled current, flowing towards the ground through-hole, and hence the inductance (non-coupled inductance) is increased. That is, if there flows much uncoupled current, the ground inductance is increased.

Since the uncoupled current in an amount corresponding to the amount of the signal current, the amount of the uncoupled current is increased in case there are a number of the signal through-holes larger than the number of the ground through-holes. If a plural number of the non-coupled currents are concentrated to a sole ground through-hole, current paths are overlapped. It has been known that the inductance, increased in direct proportion to the distance between the signal through-hole and the ground through-hole, is increased by units of times, for the same distance, depending on the state of the current overlap. Hence, it has been recognized to be crucial to reduce the distance between the signal through-hole and the ground through-hole, and to increase the number of the ground through-holes compared to that of the signal through-holes. In the Patent Document 1, there is disclosed an arrangement of through-holes in which, of the through-holes lying around signal through-holes, those lying at diagonal positions are adapted to communicate with the power supply or the ground.

Moreover, there is generated voltage drop due to resistance components of the power supply plane and to resistance components of the ground plane, as shown in FIG. 7, whereby the high potential side power supply voltage is lowered, while the low potential side power supply voltage is floated. Hence, with the decrease in the voltage of the semiconductor device, the resistances of the power supply and the ground plane become a problem.

In the designing of the package board and a printed wiring board, a variety of analyses of power supply impedances, employing a tool for analysis of an electromagnetic field, have so far been conducted for reducing the switching noise and for coping with electro-magnetic coupling EMC. A method and an apparatus for designing a printed circuit board are disclosed in Patent Document 2. In this method and apparatus, the layout information for a printed circuit board, e.g. mounting positions for active devices, such as the ground plane, power supply plane, an LSI or an IC, and decoupling capacitors, are input and, using this input information, a circuit model for calculating voltage distribution between the power supply plane and the ground plane is generated. A particular frequency is then selected and, at this particular frequency, the voltage distribution of the power supply plane and the ground plane is calculated. The voltage distribution, thus calculated, is displayed on a two-dimensional voltage map in accordance with the shape of the printed circuit board. Using this voltage map, the arraying positions of the via-holes for signal interconnections across the power supply layer and the ground layer are determined. The technique of formulating a power supply analysis model is also disclosed in Patent Document 3. In this technique of formulating the power supply analysis model, CAD data are converted into data convenient for power supply noise analyses. In case of overlap of power supply islands, i.e. power supply patterns, present in different layers, these overlapping power supply islands are extracted as power supply pairs. The power supply pairs are each divided into meshes, and wavefront patterns, which are wavefronts per wavelength of electromagnetic waves, radiated from the devices on the power supply pair areas to the power supply pair areas, are arrayed. In these power supply pair areas, nodes are arrayed, and impedance parameters (L, R and C), interconnecting the different nodes, are calculated. Using these impedance parameters, the different nodes are interconnected to formulate a power supply layer model.

[Patent Document 1]
  JP Patent Kokai Publication No. JP-P2005-19765A

[Patent Document 2]
  JP Patent Kokai Publication No. JP-P2001-147952A

[Patent Document 3]
  JP Patent Kokai Publication No. JP-P2004-334654A

SUMMARY OF THE DISCLOSURE

The conventional technique for inductance analysis, employing e.g. analysis of an electro-magnetic field, is in need of much time for analysis, and is limited to application with a small size of analysis.

In the current state of the art, there lacks a system in a tool for analysis of the electro-magnetic field which is capable of coping with an increased size of a subject for analysis and which allows for analysis to high accuracy. Such state of the art poses a serious problem as regards the tool for analysis of the electro-magnetic field.

In light of the above, it is envisaged by the present invention to provide a system, a method and a program for inductance analysis according to which it is possible to achieve shorter analysis time, to cope with an increased system size and to enable the analysis with high accuracy.

The invention disclosed in the present application is placed substantially as follows:

In a first aspect, the present invention provides an inductance analysis system for a multi-layered board including a power supply plane. The system comprises analysis means for determining the potential distribution within a power supply plane by receiving information on the power supply plane in a state in which a beginning point of non-coupled current of return current associated with signal current is placed in the vicinity of a signal through-hole on the power supply plane, based on the position information of the signal through-holes, and means for outputting the potential distribution within the power supply plane acquired. The system evaluates uncoupled inductance from the signal through-hole in the power supply plane to one or both of a power supply through-hole and a power supply via.

According to a second aspect of the present invention, the analysis means makes the potential analysis as the relationship that an increment of the voltage $\Delta V$ is expressed by the product of a non-coupled inductance L from the signal through-hole to one or both of the power supply through-hole and the power supply via and the time rate of change of the current I, that is, $\Delta V = L\Delta I/\Delta t$, is replaced by the relationship that the voltage V is expressed by the product of the resistance R and the non-coupled current I, i.e., $V = R \times I$.

According to a third aspect of the present invention, the analysis means makes the potential analysis by analyzing the two-dimensional heat diffusion in the power supply plane based on the assumption that a heat source has been placed at the beginning point of the non-coupled current.

According to a fourth aspect of the present invention, the power supply plane is a ground plane and the power supply through-hole or the power supply via is a ground through-hole or a ground via, respectively, or both the power supply through-hole and the power supply via are a ground through-hole and a ground via, respectively.

According to a fifth aspect of the present invention, the analysis means receives information on the shape of the power supply plane and one or both of the through-hole position and the via position, as inputs. The analysis unit performs potential analysis based on a two-dimensional analysis model in which one or both of the signal through-hole position and the signal via position is(are) set to a high potential and in which one or both of the ground through-hole position and the ground via position is(are) set to a zero potential.

According to a sixth aspect of the present invention, the through-hole position or the via position or both is(are) corrected and the potential distribution in the power supply plane is re-calculated. The through-hole position or the via position or both the through-hole position and the via position is(are) determined so that the potential distribution in the power supply plane will be uniform.

According to a seventh aspect of the present invention, there is provided a method for designing a multi-layered board including a power supply plane. The method includes a step of: placing a beginning point of non-coupled current of return current, associated with signal current, in the vicinity of the signal through-hole on the power supply plane, based on the position information of the signal through-hole. The method according to the present invention also includes a step of receiving information of the power supply plane and determining the potential distribution in the power supply plane, a step of receiving the information on the power supply plane and determining the potential distribution in the power supply plane, and a step of outputting the potential distribution in the power supply plane, thus determined. With the method according to the present invention, it is possible to evaluate the non-coupled inductance in the power supply plane from the signal through-hole to one or both of the power supply through-hole and the power supply via.

According to an eight aspect of the present invention, potential analysis is carried out as the relationship that a voltage increment $\Delta V$ is expressed by the product of non-coupled inductance L and the time rate of change of the current, that is, the relationship $\Delta V = L\Delta I/\Delta t$, is replaced by a relationship that the voltage is expressed by the product of a resistance R and the non-coupled current I, i.e., $V = R \times I$.

According to a ninth aspect of the present invention, potential analysis is carried out by analyzing the two-dimensional heat diffusion in the power plane, based on the assumption that a heat source has been placed at a beginning point of the non-coupled current.

According to a tenth aspect of the present invention, one or both of the through-hole position and the via position is(are) corrected and the potential distribution in the power supply plane is re-calculated, and one or both of the through-hole position and the via position is(are) determined so that the potential distribution in the power supply plane will be uniform.

According to an eleventh aspect, the present invention provides a computer program for allowing a computer, making up a system for analyzing the inductance of a multi-layered board including a power supply plane, to carry out the processing steps. The processing steps comprise: determining the potential distribution in the power supply plate, as the power supply plate information in a state in which a beginning point of the non-coupled current of the return current associated with signal current is placed in the vicinity of a signal through-hole on the power supply plane, based on the position information of the signal through-hole; and a processing of outputting the potential distribution in the power supply plane thus acquired.

The meritorious effects of the present invention are summarized as follows.

According to the present invention, in which the non-coupled inductance in a power supply plane is replaced by a resistance and potential analysis is carried out in the power supply plane to allow for evaluation and visualization of the non-coupled inductance. According to the present invention, analysis may be made highly accurately at a large scale and in a short time as compared to the case of inductance analysis by the analysis of the electromagnetic field.

BRIEF DESCRIPTION OF THE DRAWINGS

FIGS. 4A, 4B, 4C and 4D are also schematic views for illustrating the displayed results according to the present invention.

FIG. 7 is a schematic view for illustrating the mechanism of voltage drop.

PREFERRED EMBODIMENTS OF THE INVENTION

Figure 1:
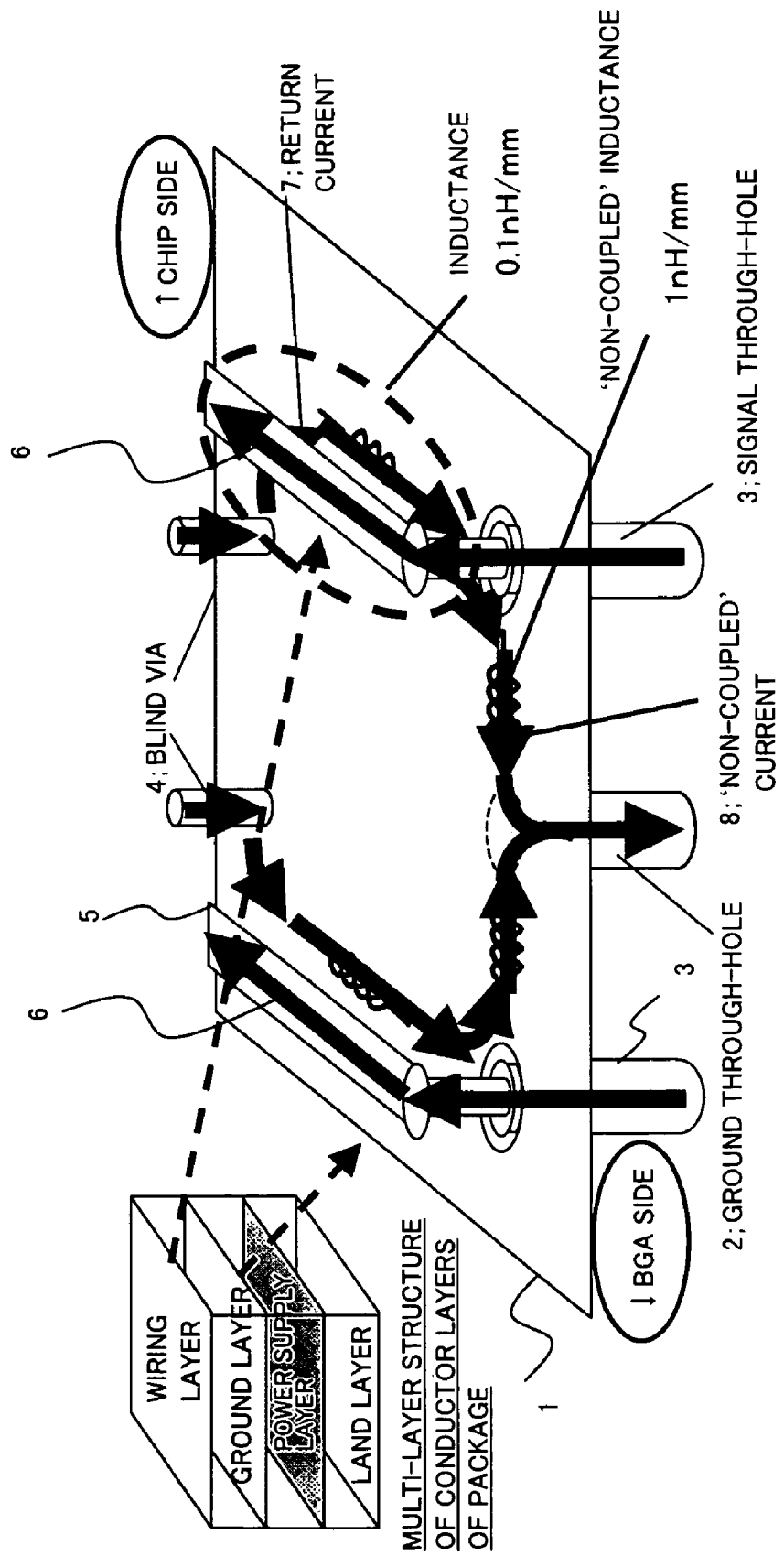
FIG. 1 is a schematic view for illustrating the principle of the present invention.

The present invention will now be described in detail with reference to the drawings. Referring to FIG. 1, signal through-holes 3 are passed through a ground plane 1. To this ground plane 1 are connected a ground through-hole 2 and blind vias 4. When signal current 6 flows through a signal wire 5 in a wiring layer, return current 7 flows on the ground plane 1 in a direction opposite to the direction along which flows the signal current 6. Due to a coupling electromagnetic field, the return current 7 flows through an area lying directly below the signal wire 6. However, the return current is not coupled to an electromagnetic field of non-coupled current 8 proceeding towards the ground through-hole 2, and hence the inductance (non-coupled inductance) is increased. That is, if there flows much non-coupled current, the ground inductance is increased. There are occasions where, for example, the non-coupled inductance is as high as 1 nH/mm for the coupled inductance of 0.1 nH/mm. The non-coupled current 8 flows in association with the signal current 6, so that, if there are a large plural number of signal through-holes 3 in association with one ground through-hole 2, the current paths become overlapped, thus leading to yield of congested current paths of the non-coupled currents. For reducing the inductance, it is crucial to reduce the non-coupled inductance and to eliminate or mitigate the congestion of the current paths of the non-coupled currents.

Figure 2:
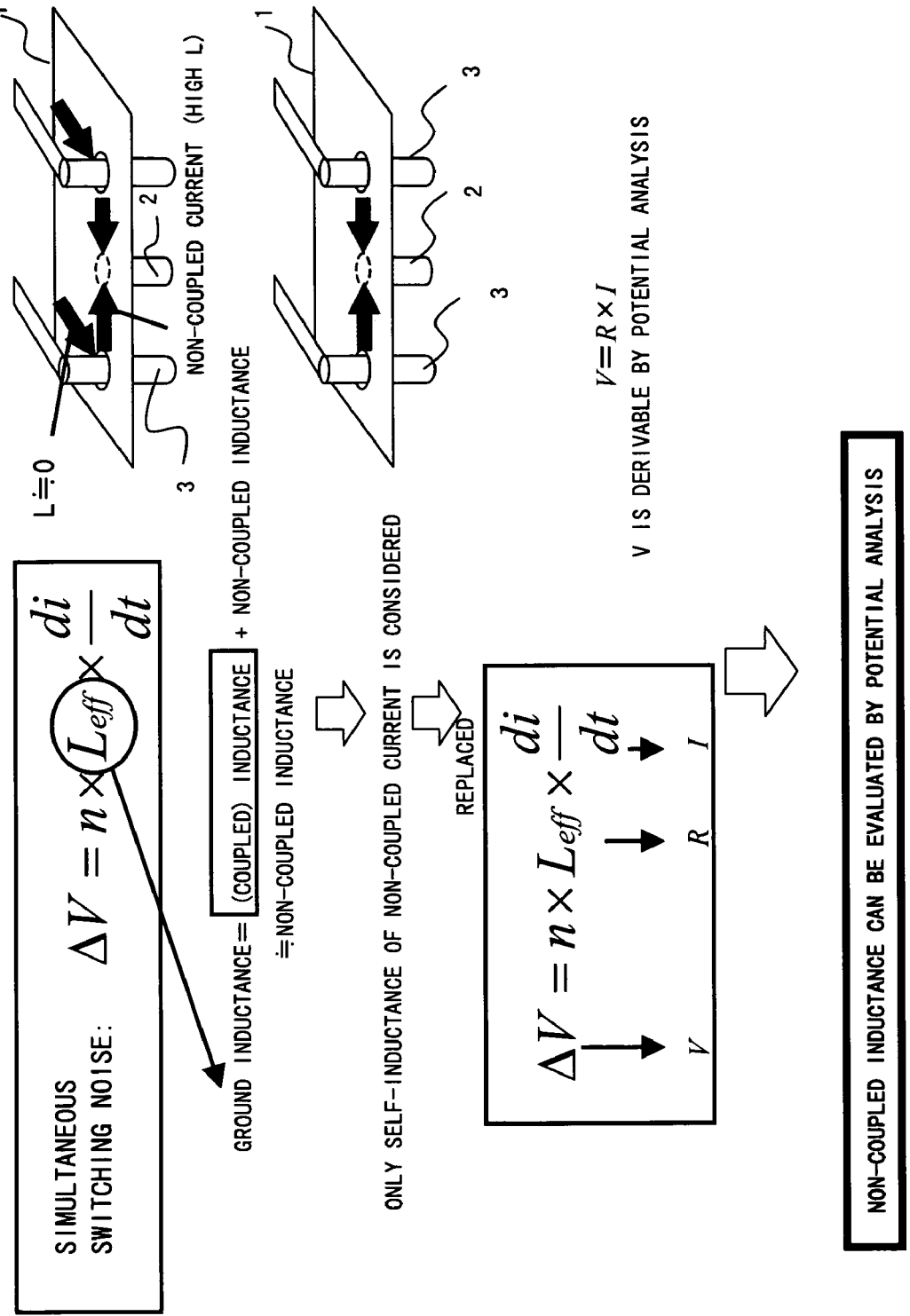
FIG. 2 is also a schematic view for illustrating the principle of the present invention.

According to the present invention, the non-coupled inductance is replaced by resistance, as explained below with reference to FIG. 2. The simultaneous switching noise ΔV of the signal is given by the following equation (1):

$$\Delta V = n \times L_{eff} \times di/dt \quad (1)$$

where n is the number of signal paths and $L_{eff}$ is the ground inductance and is a sum of the coupled inductance and the non-coupled inductance. Since $$\text{coupled inductance} < \text{non-coupled inductance} \quad (2)$$

the ground inductance may be approximated by the non-coupled inductance.

Only the self-inductance of the non-coupled current from the signal through-hole to the ground through-hole is considered.

In the present embodiment, the self-inductance of the non-coupled current is replaced by a resistance R, and $\Delta V = n \times L_{eff} \times di/dt$ is replaced by $$V = R \times I \quad (3)$$

This V may be derived by potential analyses. That is, the non-coupled inductance may be evaluated by two-dimensional potential analysis within the ground plane. This configuration is one of the features of the present invention.

Figure 3:
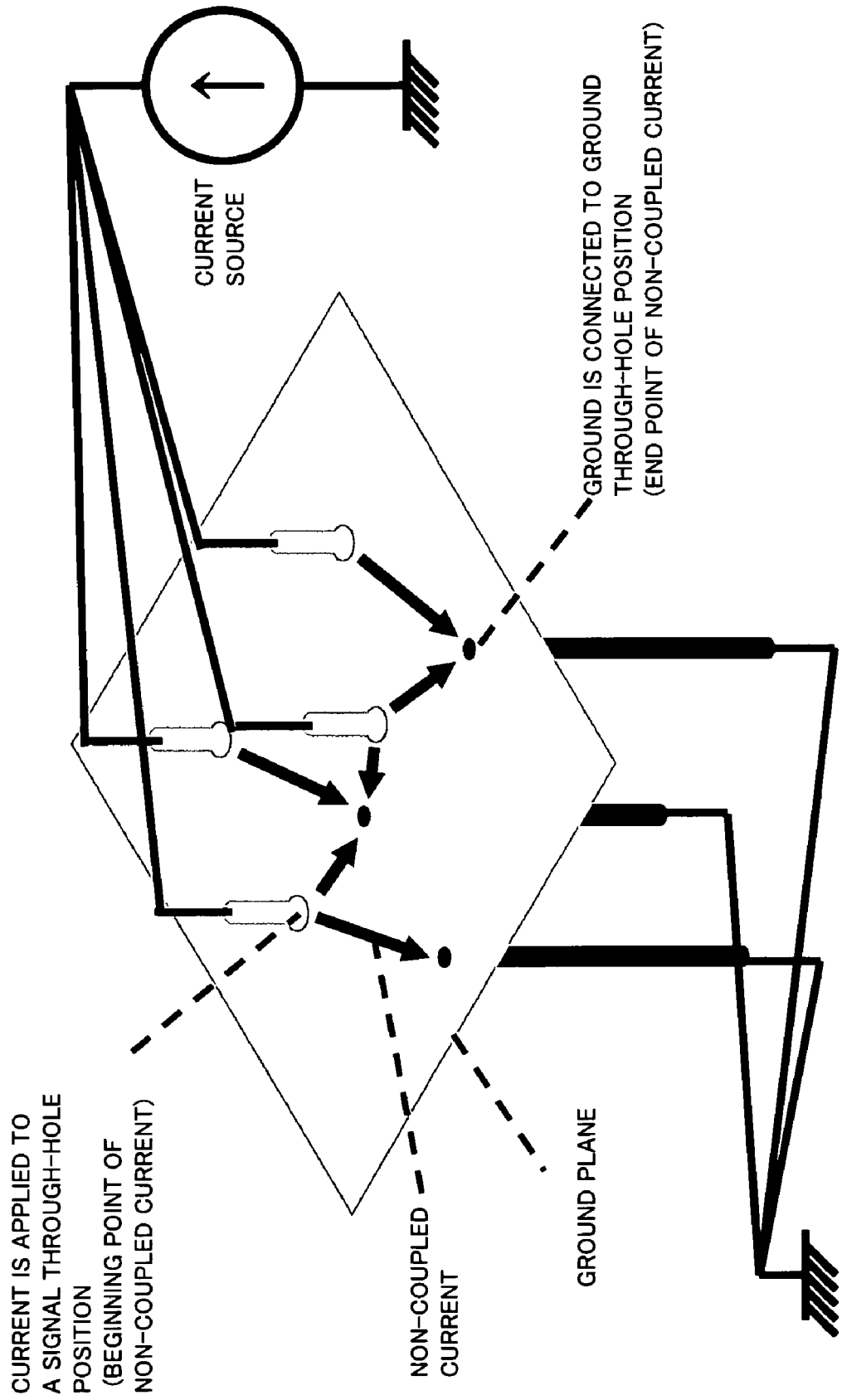
FIG. 3 is also a schematic view for illustrating the potential analysis according to the present invention.

The analysis of the potential within the ground plane, generated by the non-coupled current, will now be described with reference to the drawings. FIG. 3 illustrates the potential analysis. The current is caused to flow from a current source to the location of a signal through-hole which is to be a beginning point of the non-coupled current. The ground potential is connected to the location of the ground through-hole. The mutual conductance between non-coupled currents is to be disregarded.

The potential distribution within the ground plane is determined, using two-dimensional thermal analysis, for example. For formulating a model, the non-coupled inductance is replaced by thermal resistance and the potential distribution in the ground plane is replaced by temperature distribution. In the thermal conduction analysis system, the beginning point of the non-coupled current of FIG. 3 may be simulated by a heat source (unit heat source) arranged at a relevant location within the ground plane. In the thermal conduction analysis system, the following two-dimensional heat diffusion equation $$\frac{\partial T}{\partial t} = k \left( \frac{\partial^2 T}{\partial x^2} + \frac{\partial^2 T}{\partial y^2} \right) \quad (4)$$

is solved with respect to the temperature T, where T, k and t denote the temperature, coefficient of thermal conductivity and time, respectively, and x, y denote x-y coordinates.

In solving the potential within the ground plane by the two-dimensional heat diffusion equation, it is assumed that the boundary is assumed to be in the heat insulated state (heat exchange=0). As techniques for calculating T of the above two-dimensional heat diffusion equation (4), any of known techniques, such as the finite element method, may be used.

FIGS. 4A, 4B, 4C and 4D show the results of the analysis of the non-coupled inductance employing the potential analysis. FIGS. 4A and 4B show the positions of signal through-holes and ground through-holes (vias) in the ground plane and FIGS. 4C and 4D show outputs of the potential distribution of the ground plane of FIGS. 4A and 4B.

If the signal through-holes and the ground through-holes are congested, as shown in FIG. 4A, the current paths of the non-coupled currents are overlapped. In such case, the potential distribution is not uniform, as indicated by the outputs of the results of the analysis shown in FIG. 4D.

If, on the other hand, the signal through-holes and the ground through-holes are arranged uniformly, as shown in FIG. 4B, the current paths are distributed, as shown by the outputs of the results of analysis of FIG. 4D.

The locations of the signal through-holes and the ground through-holes are extracted from the layout information of the multi-layered wiring board, having a power supply plane.

The current source of the return current is located in the vicinity of the signal through-hole in the ground plane and the non-coupled inductance from the signal through-hole to the ground through-hole is replaced by a resistance. The potential distribution in the ground plane by the non-coupled return current is then determined to render it possible to evaluate the magnitude of the non-coupled inductance component.

The results of the potential analysis are output as images to e.g. a display and the ground through-holes or the signal through-holes, are re-located, or both the ground through-holes and the signal through-holes are re-located, as appropriate. The potential distribution is determined and the locations of the ground through-holes and the signal through-holes are optimized to provide for optimum potential distribution and low potential.

According to the present invention, the potential analysis by the two-dimensional thermal diffusion equation within the ground plane based on through-hole positions is used, so that the time for analysis may be made shorter. Hence, the present invention may be applied to analyses of large size systems. If the analysis of the electro-magnetic field is used, the time for analysis is prolonged, while the possible range of analysis is small. Moreover, according to the present invention, the non-coupled inductance may be visualized by displaying the potential distribution by equi-potential display, thereby assuring facilitated feedback to the design stage. The non-coupled potential may be evaluated by displaying the potential distribution (equi-potential display), thereby optimizing the arrangement of vias and through-holes connecting to the power supply and to the ground, and realizing uniform disposition of the ground through-holes, for example.

According to the present invention, in which the routes of the signal lines, coupled to the power supply and to the ground plane, are eliminated from the subject to be analyzed, and the potential analysis is carried out based on the position information of the through-holes and vias in the ground plane, it is made possible to analyze a large sized system as analysis is simplified and high analysis accuracy is maintained.

Moreover, according to the present invention, it is possible to analyze electrical characteristics of a multi-layered 2-metal type package board, while it is also possible to design a low-noise package board which is able to cope with high-speed low-voltage operations.

EMBODIMENT OF THE INVENTION

Figure 5:
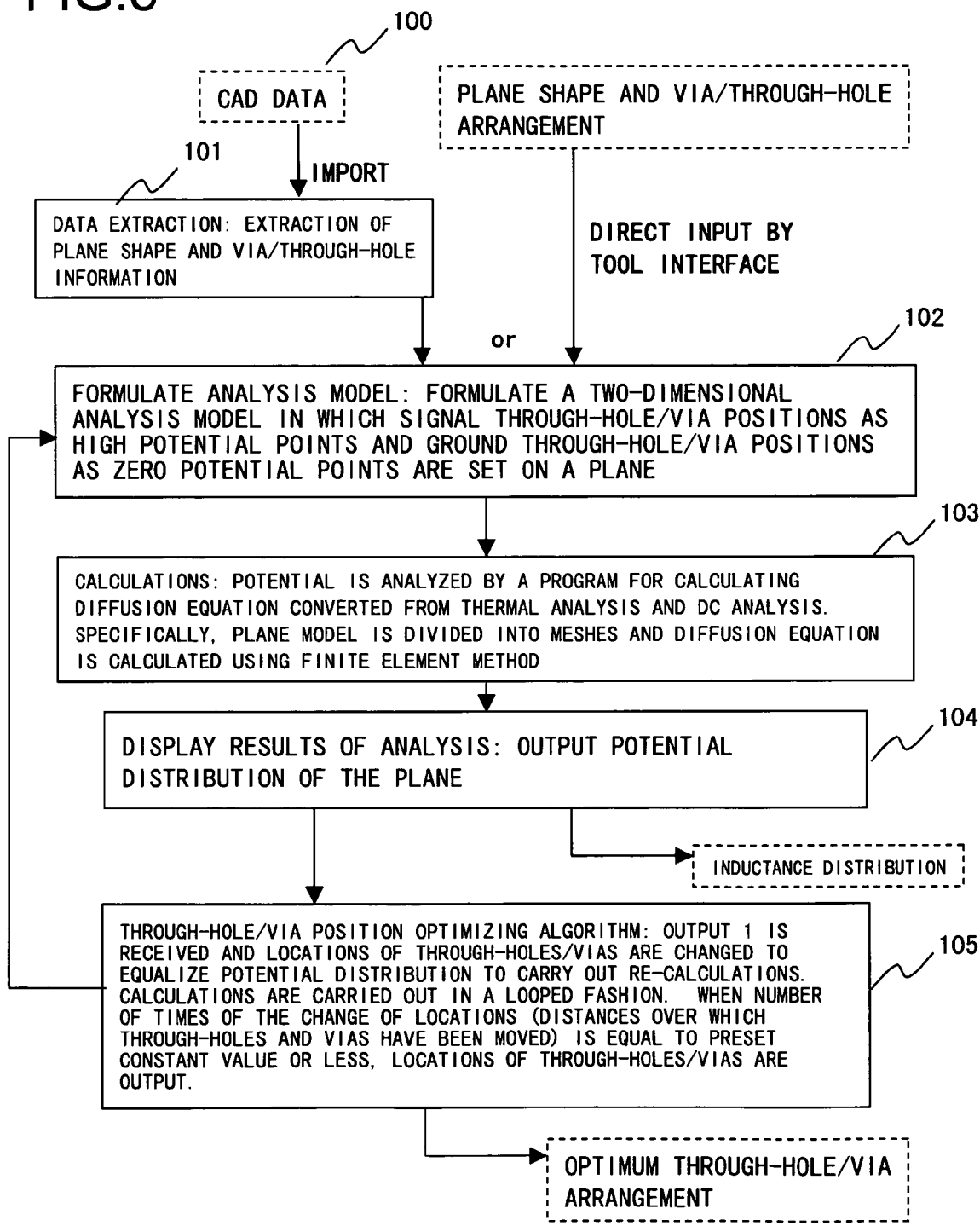
FIG. 5 is a flowchart for illustrating the configuration of an embodiment of the present invention.
Figure 6:
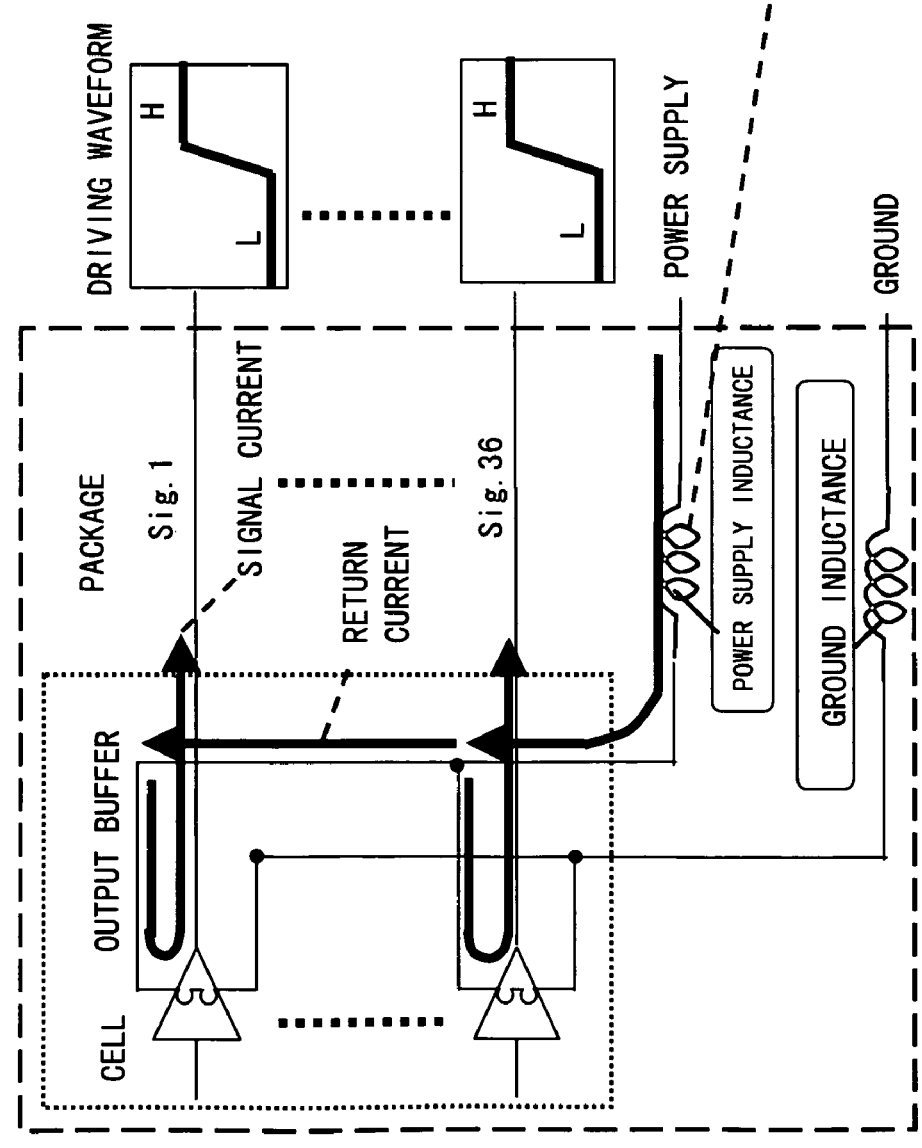
FIG. 6 is a schematic view for illustrating the generation of a simultaneous noise generating mechanism.

FIG. 5 depicts a functional block diagram showing a system according to an embodiment of the present invention. In the system of FIG. 5, a data extraction unit 101 receives CAD data 100 to extract the plane shape, via information and the through-hole information. The plane shape, via information and the through-hole information may be directly transmitted to an analysis model formulating unit 102, from a preset input interface, in place of extracting the plane shape, via information and the through-hole information from the CAD data 100.

The analysis model formulating unit 102 receives the plane shape, via information and the through-hole information, as extracted from the data extraction unit 101. Or, the analysis model formulating unit receives the plane shape, via information and the through-hole information through e.g. a preset interface. A two-dimensional model for the ground plane is formulated, under the conditions that the positions of the signal through-holes and the vias are set to a high potential, and the ground through-hole and via positions are set to a low potential.

The calculating unit 103 performs potential analysis, using e.g. a two-dimensional heat diffusion equation, in order to acquire the potential distribution in the ground plane. The model within the ground plane is divided into meshes, and the heat diffusion equation is calculated, using the finite element method.

Or, the calculating unit 103 may determine the potential distribution in the plane, using the DC (direct current) analysis.

An analysis result display 104 displays the potential distribution, and hence the distribution of unknown inductances, within the ground plane, with color or with gray scale, to output the so displayed potential distribution.

A through-hole/via location optimizing unit (through-hole/via location optimizing algorithm execution unit) 105 receives an output of the potential distribution (results of calculations) as input and changes the through-hole positions and the via positions. The through-hole/via location optimizing unit then re-calculates the potential in the ground plane and corrects the through-hole locations and the via locations so that the potential distribution will be uniform. When the number of times of changes of the locations (the distances over which the through-hole positions and the via positions have been moved) has become smaller than a predetermined constant value, the through-hole/via location optimizing unit may deem that the through-hole positions and the via positions have been optimized, and accordingly may output the through-hole positions and the via positions.

The present invention may be applied with advantage to analyses of multi-layered boards, including a power supply plane and a ground plane, such as package boards. In addition, the present invention may be applied to analyses of multi-layered wiring boards, including a power supply plane and a ground plane, such as multi-layered printed wiring boards.

Meanwhile, the processing and the functions of the data extraction unit 101, analysis model formulating unit 102, calculating unit 103, analysis result display 104 and the through-hole/via location optimizing unit 105 of the system shown in FIG. 5 may, of course, be implemented by a program executed on a computer which makes up the system. The steps comprised in the method and the processing steps may be embodied as the processing steps of the program that is computer-processed.

Although the present invention has so far been explained with reference to the preferred embodiments, the present invention is not limited to the particular configurations of these embodiments. It will be appreciated that the present invention may encompass various changes or corrections such as may readily be arrived at by those skilled in the art within the scope and the principle of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An inductance analysis system for a multi-layered board including a power supply plane, said system comprising:

analysis means for determining a potential distribution within a power supply plane by receiving information on a power supply plane in a state in which a beginning point of non-coupled current of return current associated with signal current is placed in a vicinity of a signal through-hole on said power supply plane, based on position information of said signal through-hole; and means for outputting the potential distribution within said power supply plane acquired, wherein said analysis means evaluates uncoupled inductance from said signal through-hole in said power supply plane to at least one of a power supply through-hole and a power supply via, and wherein said analysis means performs potential distribution analysis by analyzing two-dimensional heat diffusion in said power supply plane based on an assumption that a heat source has been placed at said beginning point of said non-coupled current.

2. The inductance analysis system according to claim 1 wherein said power supply plane is a ground plane, and said power supply through-hole or said power supply via is a ground through-hole or a ground via, respectively, or both said power supply through-hole and said power supply via are a ground through-hole and a ground via, respectively.

3. The inductance analysis system according to claim 1 wherein said analysis means receives information on the shape of the power supply plane and the at least one of the power supply through-hole positions and the power supply via positions, as inputs, and wherein said analysis means performs potential analysis based on a two-dimensional analysis model in which the at least one of the signal through-hole positions and the signal via positions is set to a high potential and in which at least one of the power supply through-hole positions and the power supply via positions is set to a zero potential.

4. The inductance analysis system according to claim 1 wherein the at least one of said power supply through-hole positions and the power supply via positions is corrected and the potential distribution in the power supply plane is re-calculated; and the at least one of the power supply through-hole positions and the power supply via positions is determined so that the potential distribution in said power supply plane will be uniform.

5. An inductance analysis system for a multi-layered board including a power supply plane, said system comprising:

analysis means for determining a potential distribution within a power supply plane by receiving information on a power supply plane in a state in which a beginning point of non-coupled current of return current associated with signal current is placed in a vicinity of a signal through-hole on said power supply plane, based on position information of said signal through-hole; and means for outputting the potential distribution within said power supply plane acquired, wherein said analysis means evaluates uncoupled inductance L from said signal through-hole in said power supply plane to at least one of a power supply through-hole and a power supply via, wherein, with the uncoupled inductance L being expressed by resistance R, said uncoupled inductance L representing an inductance from said signal through-hole to the at least one of said power supply through-hole and said power supply via, said analysis means makes said potential distribution analysis based on a relationship that voltage V is expressed by a product of said resistance R and the non-coupled current I, i.e., V=R×I, and wherein said analysis means performs the potential distribution analysis by analyzing the two-dimensional temperature distribution in said power supply plane based on an assumption that said resistance R is thermal resistance and that a heat source has been placed at said beginning point of said non-coupled current.

6. A method for designing a multi-layered board including a power supply plane, said method comprising the steps of:

placing a beginning point of non-coupled current of return current, associated with signal current, in a vicinity of a signal through-hole on said power supply plane, based on position information of said signal through-hole;

receiving information on said power supply plane and determining a potential distribution in said power supply plane by using a computer; and outputting the potential distribution in said power supply plane thus determined, thereby evaluating the non-coupled inductance in said power supply plane from said signal through-hole to at least one of said power supply through-hole and said power supply via, wherein said potential distribution is determined by analyzing two-dimensional thermal diffusion in said power supply plane based on an assumption that a heat source has been placed at a beginning point of said non-coupled current.

7. A method for designing a multi-layered board including a power supply plane, said method comprising the steps of:

placing a beginning point of non-coupled current of return current, associated with signal current, in a vicinity of a signal through-hole on said power supply plane, based on position information of said signal through-hole;

receiving information on said power supply plane and determining a potential distribution in said power supply plane by using a computer; and outputting the potential distribution in said power supply plane thus determined, thereby evaluating the non-coupled inductance L in said power supply plane from said signal through-hole to at least one of said power supply through-hole and said power supply via, wherein said potential distribution is determined by replacing the potential distribution by a relationship that voltage V is represented by a product of resistance R and the non-coupled current I, i.e. V=R×I, where the non-coupled inductance L from said signal through-hole to the at least one of a power supply through-hole and a power supply via is represented by said resistance R, and wherein potential distribution analysis is carried out by analyzing two-dimensional temperature distribution in said power supply plane based on an assumption that said resistance is thermal resistance and that a heat source has been placed at a beginning point of said non-coupled current.

8. A method for designing a multilayer circuit board which includes a power supply plane, the method comprising:

inputting information defining a shape of the power supply plane and locations of power supply through-holes and power supply vias in the power supply plane;

inputting information defining a location of signal through-holes in the power supply plane;

placing simulated thermal resistances between the signal through-holes and adjacent power supply through-holes and power supply vias;

placing simulated heat sources at beginning points of non-coupled currents in vicinities of the signal through-holes to simulate non-coupled current flow from the signal through-holes to the adjacent power supply through-holes and power supply vias;

determining a potential distribution in the power supply plane by solving a two-dimensional heat diffusion equation to obtain a temperature distribution as an analog to the potential distribution;

determining non-coupled inductance in the power supply plane between the signal through-holes and the power supply through-holes and power supply vias by solving equation $V = I \times R$, wherein V is provided by the determined potential distribution, I is a return current source located in a vicinity of a signal through-hole, and the non-coupled inductance is approximated by a resistance R; and optimizing the placement of the signal through-holes and the power supply through-holes in the power supply plane based on the determined non-coupled inductance between the signal through-holes and the power supply through-holes and power supply vias.

9. The method of claim 8, wherein a finite element technique is used to solve the two-dimensional heat diffusion equation.

\* \* \* \* \*